(12) United States Patent
Mizuguchi et al.

(10) Patent No.: US 11,422,528 B2
(45) Date of Patent: Aug. 23, 2022

(54) SUBSTRATE PROCESSING SYSTEM, METHOD OF MANUFACTURING SEMICONDUCTOR DEVICE, AND RECORDING MEDIUM

(71) Applicant: KOKUSAI ELECTRIC CORPORATION, Tokyo (JP)

(72) Inventors: Yasuhiro Mizuguchi, Toyama (JP); Shun Matsui, Toyama (JP); Tadashi Takasaki, Toyama (JP); Naofumi Ohashi, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 34 days.

(21) Appl. No.: 16/918,626

(22) Filed: Jul. 1, 2020

(65) Prior Publication Data
US 2021/0003990 A1 Jan. 7, 2021

(30) Foreign Application Priority Data
Jul. 4, 2019 (JP) .............................. JP2019-125202

(51) Int. Cl.
*G05B 19/406* (2006.01)
*H01L 21/67* (2006.01)

(52) U.S. Cl.
CPC ...... *G05B 19/406* (2013.01); *H01L 21/67167* (2013.01); *G05B 2219/45031* (2013.01)

(58) Field of Classification Search
None
See application file for complete search history.

(56) References Cited

U.S. PATENT DOCUMENTS 6,233,492 B1 * 5/2001 Nakamura ........ H01L 21/67276
700/2
6,269,279 B1 7/2001 Todate et al.
(Continued)

FOREIGN PATENT DOCUMENTS

JP 11-016797 A 1/1999
JP 2013-201299 A 10/2013
(Continued)

OTHER PUBLICATIONS

Japanese Office Action dated Mar. 23, 2021 for Japanese Patent Application No. 2019-125202.
(Continued)

*Primary Examiner* — Jennifer L Norton
(74) *Attorney, Agent, or Firm* — Volpe Koenig

(57) ABSTRACT

There is provided a technique that includes a plurality of substrate processing apparatuses each configured to process a substrate; a first controller installed in each substrate processing apparatus among the plurality of substrate processing apparatuses and configured to control the substrate processing apparatus; a relay configured to receive a plurality of types of data from the first controller; and a second controller configured to receive the data from the relay, wherein the relay is configured to change a transmission interval of the data to the second controller according to one of each type of the data and each first controller, or according to both of each type of the data and each first controller.

16 Claims, 12 Drawing Sheets

(56) References Cited

U.S. PATENT DOCUMENTS

| | | | | |
|---|---|---|---|---|
| 6,757,580 | B2* | 6/2004 | Shimada | G05B 19/4184 700/108 |
| 7,257,457 | B2* | 8/2007 | Imai | H01J 37/32935 700/121 |
| 7,376,479 | B2* | 5/2008 | Tanaka | G05B 23/0221 700/108 |
| 7,647,131 | B1* | 1/2010 | Sadowski | G06F 21/82 700/108 |
| 9,270,604 | B2 | 2/2016 | Tokutsu et al. | |
| 9,915,939 | B2* | 3/2018 | Duwuri | H04L 67/10 |
| 2004/0176868 | A1* | 9/2004 | Haga | G05B 19/418 700/121 |
| 2005/0177269 | A1* | 8/2005 | Funk | G05B 19/4187 700/121 |
| 2012/0116659 | A1* | 5/2012 | Yuasa | G08G 1/096716 709/227 |
| 2015/0148935 | A1 | 5/2015 | Koshimaki | |
| 2017/0159181 | A1 | 6/2017 | Toyoda et al. | |
| 2017/0279518 | A1* | 9/2017 | Chang | H04B 7/15592 |
| 2018/0025920 | A1 | 1/2018 | Mizuguchi | |

FOREIGN PATENT DOCUMENTS

| | | |
|---|---|---|
| JP | 2014-116453 A | 6/2014 |
| JP | 2017-103356 A | 6/2017 |
| KR | 10-1998-0086695 A | 12/1998 |
| TW | 201812905 A | 4/2018 |
| WO | 2014/007081 A1 | 1/2014 |
| WO | 2014/017069 A1 | 1/2014 |

OTHER PUBLICATIONS

Taiwanese Office Action dated Jul. 16, 2021 for Taiwanese Patent Application No. 109122219.

Korean Office Action dated Nov. 17, 2021 for Korean Patent Application No. 10-2020-0080717.

* cited by examiner

FIG. 6

| Data type | Importance level |
|---|---|
| Alarm data | 1 |
| Process data | 1 |
| Device operation data | 2 |
| Regular inspection data | 3 |
| ⋮ | ⋮ |
| Other data | N |

FIG. 7

| Data type | Interrupt enable/disable |
|---|---|
| Alarm data | No |
| Process data | No |
| Device operation data | Yes |
| Regular inspection data | Yes |
| ⋮ | ⋮ |
| Other data | Yes/No |

FIG. 8

| | Data type | Importance level | Load level 1 | Load level 2 | Load level 3 | ... | Load level N |
|---|---|---|---|---|---|---|---|
| Transmission interval | Alarm data | 1 | 1 | 1 | 1 | ... | 1 |
| | Process data | 2 | 1 | 1 | 2 | ... | 2 |
| | Device operation data | 3 | 1 | 2 | 3 | ... | 3 |
| | Regular inspection data | 4 | 1 | 2 | 3 | ... | 4 |
| | ⋮ | ⋮ | ⋮ | ⋮ | ⋮ | ... | ⋮ |
| | Other data | N | X | X | X | ... | X |

← Low load    Load level    High load →

FIG. 9

|  | Transmission destination 1 (Operator) | Transmission destination 2 (Relay) | ... | Transmission destination N |
|---|---|---|---|---|
| Alarm data | Yes | No | ... | Yes/No |
| Process data | Yes | No | ... | Yes/No |
| Device operation data | No | Yes | ... | Yes/No |
| Regular inspection data | No | Yes | ... | Yes/No |
| ⋮ | ⋮ | ⋮ | ⋯ | ⋮ |
| Other data | Yes/No | Yes/No | ... | Yes/No |

FIG. 10

| | Transmission destination 1 (Operator) | Transmission destination 2 (Host device) | ... | Transmission destination N |
|---|---|---|---|---|
| Alarm data | Yes | Yes | ... | Yes/No |
| Process data | Yes | Yes | ... | Yes/No |
| Device operation data | Yes | No | ... | Yes/No |
| Regular inspection data | Yes | No | ... | Yes/No |
| ⋮ | ⋮ | ⋮ | ... | ⋮ |
| Other data | Yes/No | Yes/No | ... | Yes/No |

…

SUBSTRATE PROCESSING SYSTEM, METHOD OF MANUFACTURING SEMICONDUCTOR DEVICE, AND RECORDING MEDIUM

CROSS-REFERENCE TO RELATED APPLICATION

This application is based upon and claims the benefit of priority from Japanese Patent Application No. 2019-125202, filed on Jul. 4, 2019, the entire contents of which are incorporated herein by reference.

TECHNICAL FIELD

The present disclosure relates to a substrate processing system, a method of manufacturing a semiconductor device, and a recording medium.

BACKGROUND

As a substrate processing apparatus used in a process of manufacturing a semiconductor device, for example, there is an apparatus including a module with a reactor. In such a substrate processing apparatus, apparatus operation information or the like is displayed on an input/output device including a display or the like so that an apparatus manager can confirm the information.

SUMMARY

Some embodiments of the present disclosure provide a technique for managing a substrate processing apparatus with high efficiency.

According to one or more embodiments of the present disclosure, there is provided a technique that includes a plurality of substrate processing apparatuses each configured to process a substrate; a first controller installed in each substrate processing apparatus among the plurality of substrate processing apparatuses and configured to control the substrate processing apparatus; a relay configured to receive a plurality of types of data from the first controller; and a second controller configured to receive the data from the relay, wherein the relay is configured to change a transmission interval of the data to the second controller according to one of each type of the data and each first controller, or according to both of each type of the data and each first controller.

BRIEF DESCRIPTION OF DRAWINGS

FIG. 6 shows an example of an importance level setting table for each data type according to one or more embodiments.

FIG. 7 shows an example of an interrupt enable/disable setting table for each data type according to one or more embodiments.

FIG. 8 shows an example of a transmission interval setting table of for each data type, importance level, and load level according to one or more embodiments.

FIG. 9 shows an example of a transmission destination setting table for each data type according to one or more embodiments.

FIG. 10 shows an example of a transmission destination setting table for each data type according to one or more embodiments.

DETAILED DESCRIPTION

Hereinafter, one or more embodiments of the present disclosure will be described.

One or More Embodiments

One or more embodiments of the present disclosure will be described with reference to the drawings.

First, problems to be solved by the present disclosure will be described. When operating a plurality of substrate processing apparatuses, at least the following problems may occur.

(a) When operating a plurality of substrate processing apparatuses with one operator, a large load may be applied to the operator. Due to this load, processing of the operator may be delayed, processing may be temporarily stopped, or the like. Such a problem occurs when the amount of data to be handled becomes larger than the transmission rate/reception rate of data of a signal line connecting each part, the storage device capacity, the memory capacity, the calculation speed of each part, or the like. The amount of data to be handled by the substrate processing apparatuses tends to increase, and there is a problem that cannot be solved by simply improving the performance of each part.

To overcome such a problem, a substrate processing system of the present disclosure is configured as described below.

(1) Configuration of Substrate Processing System

Figure 1:
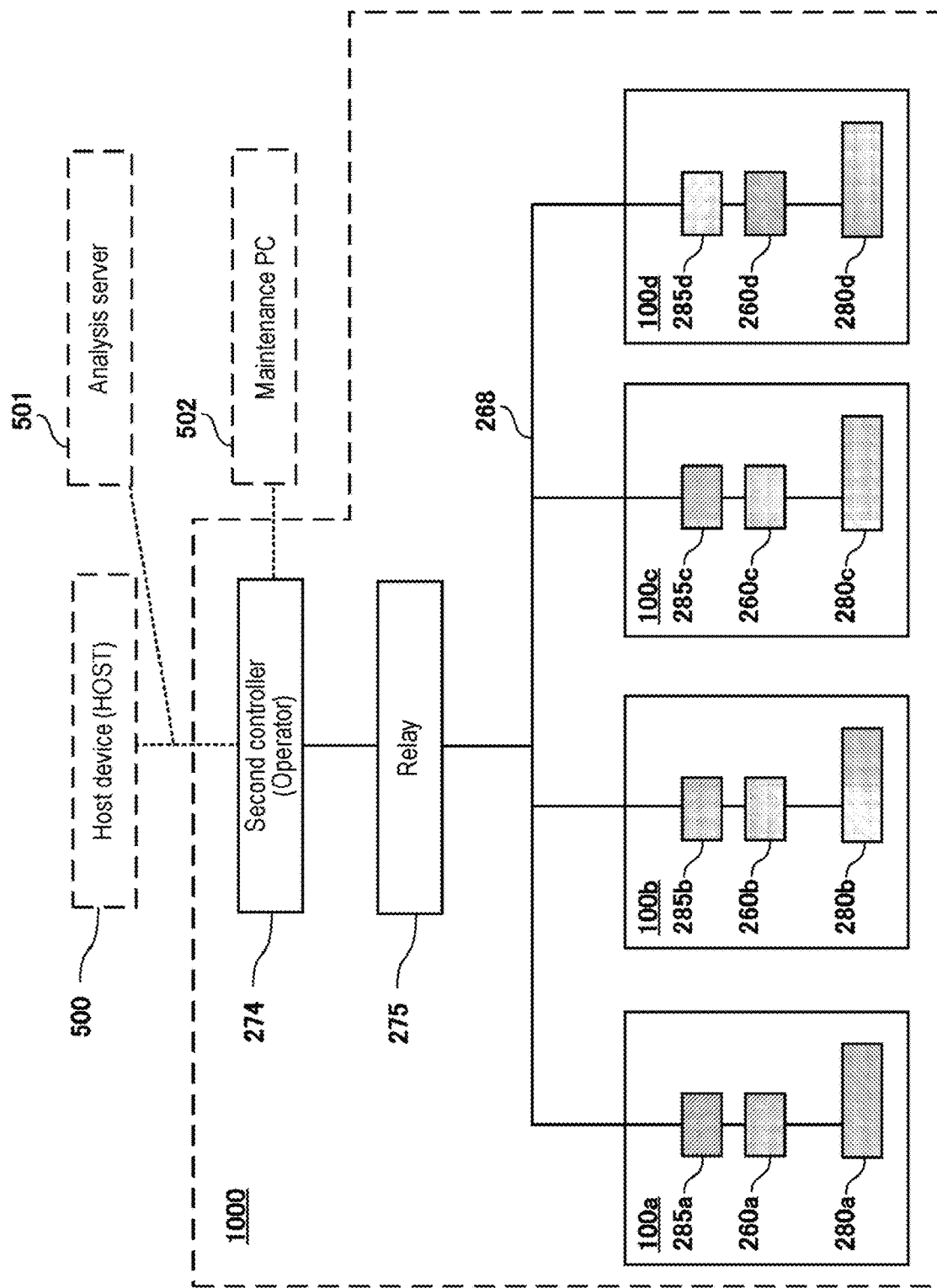
FIG. 1 is a schematic configuration diagram of a network in a substrate processing system according to one or more embodiments.
Figure 2:
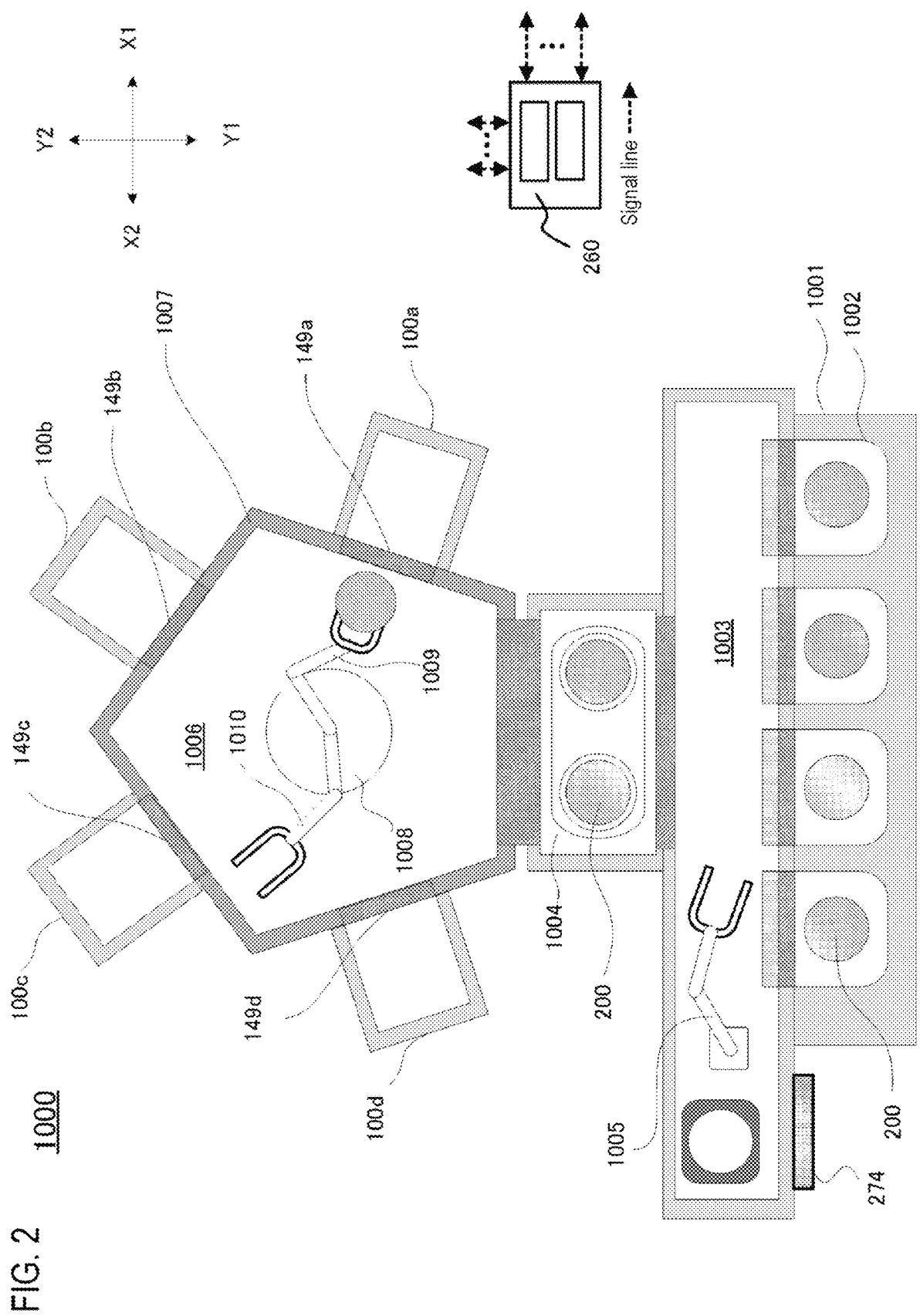
FIG. 2 is a schematic configuration diagram of a substrate processing system according to one or more embodiments.
Figure 3:
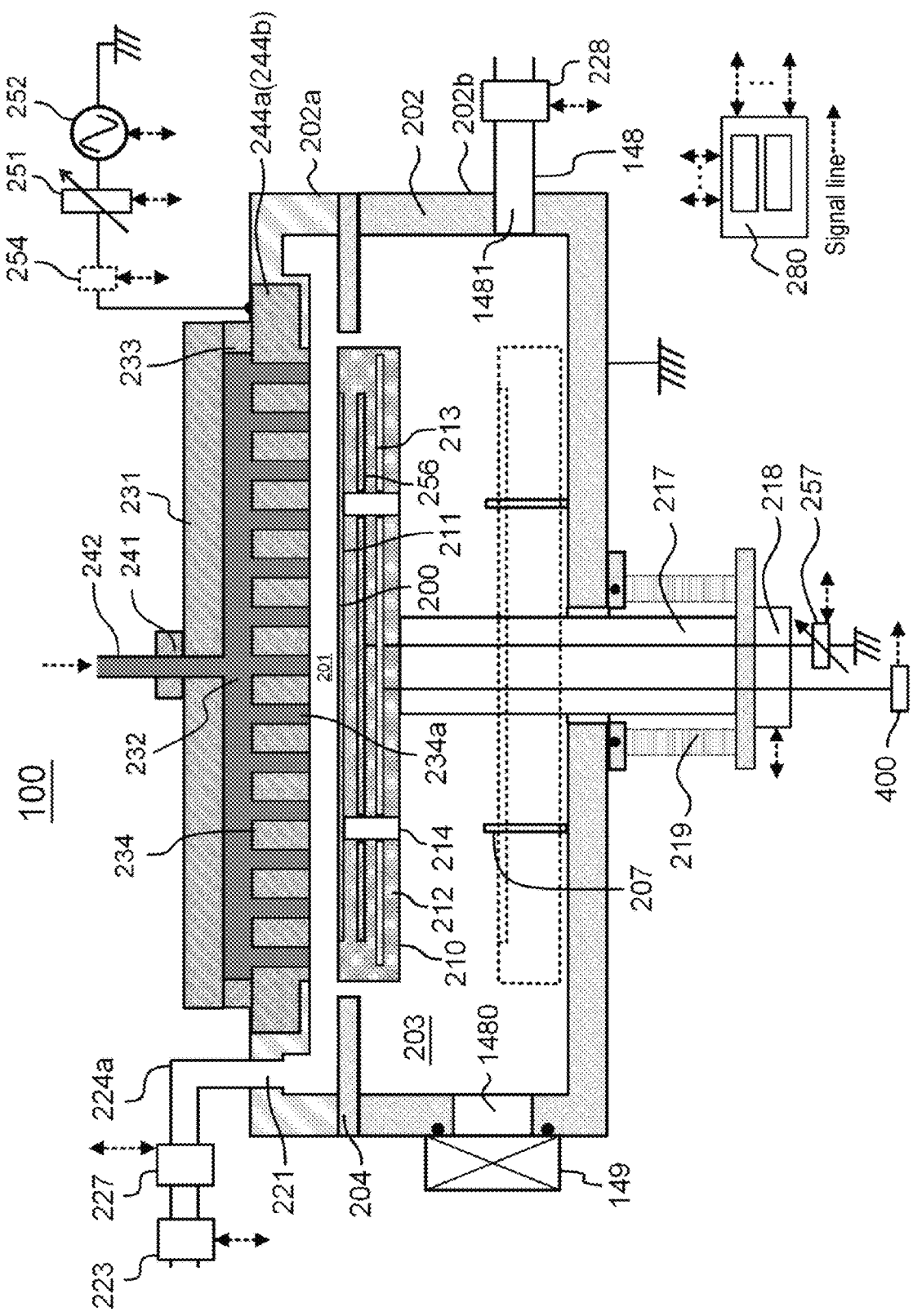
FIG. 3 is a schematic configuration diagram of a substrate processing apparatus according to one or more embodiments.
Figure 4:
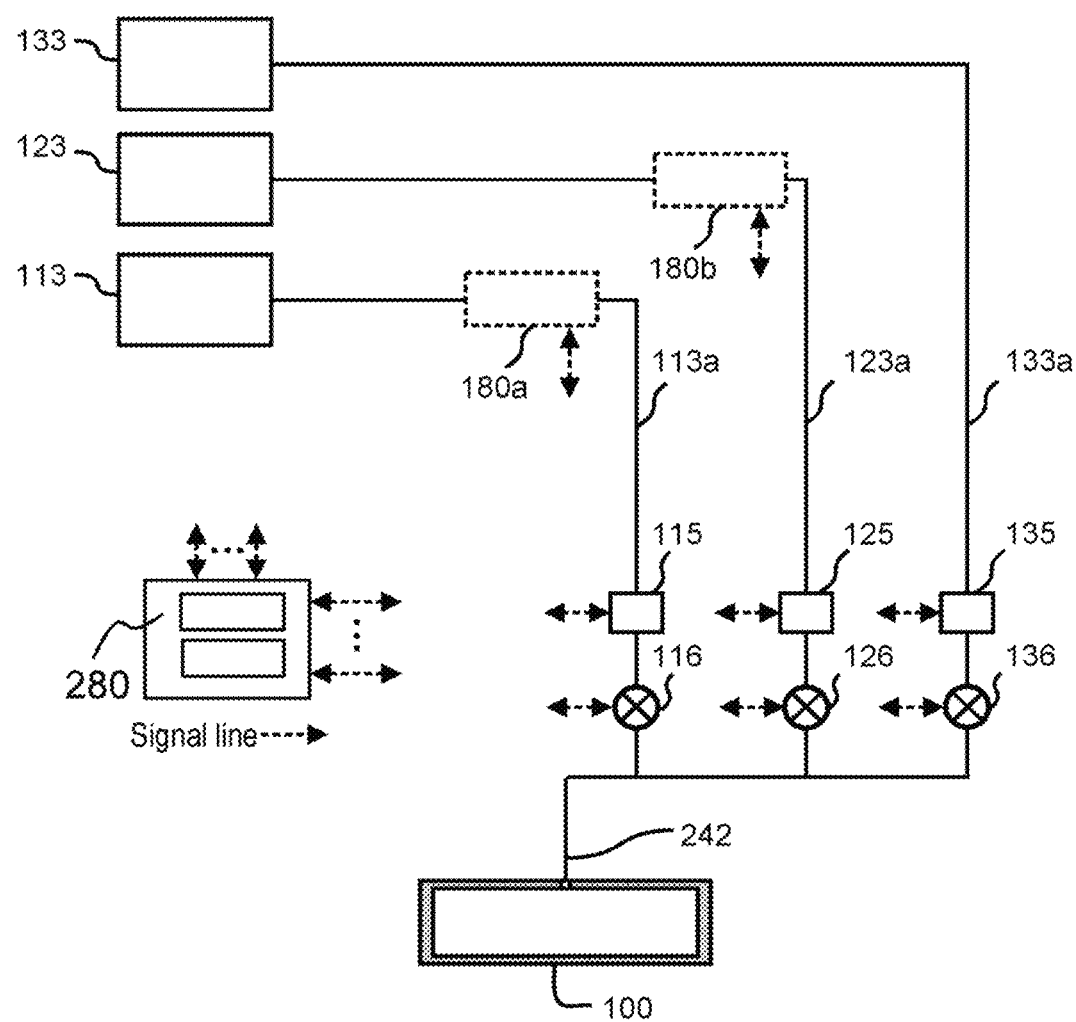
FIG. 4 is a view for explaining a gas supplier according to one or more embodiments.
Figure 5:
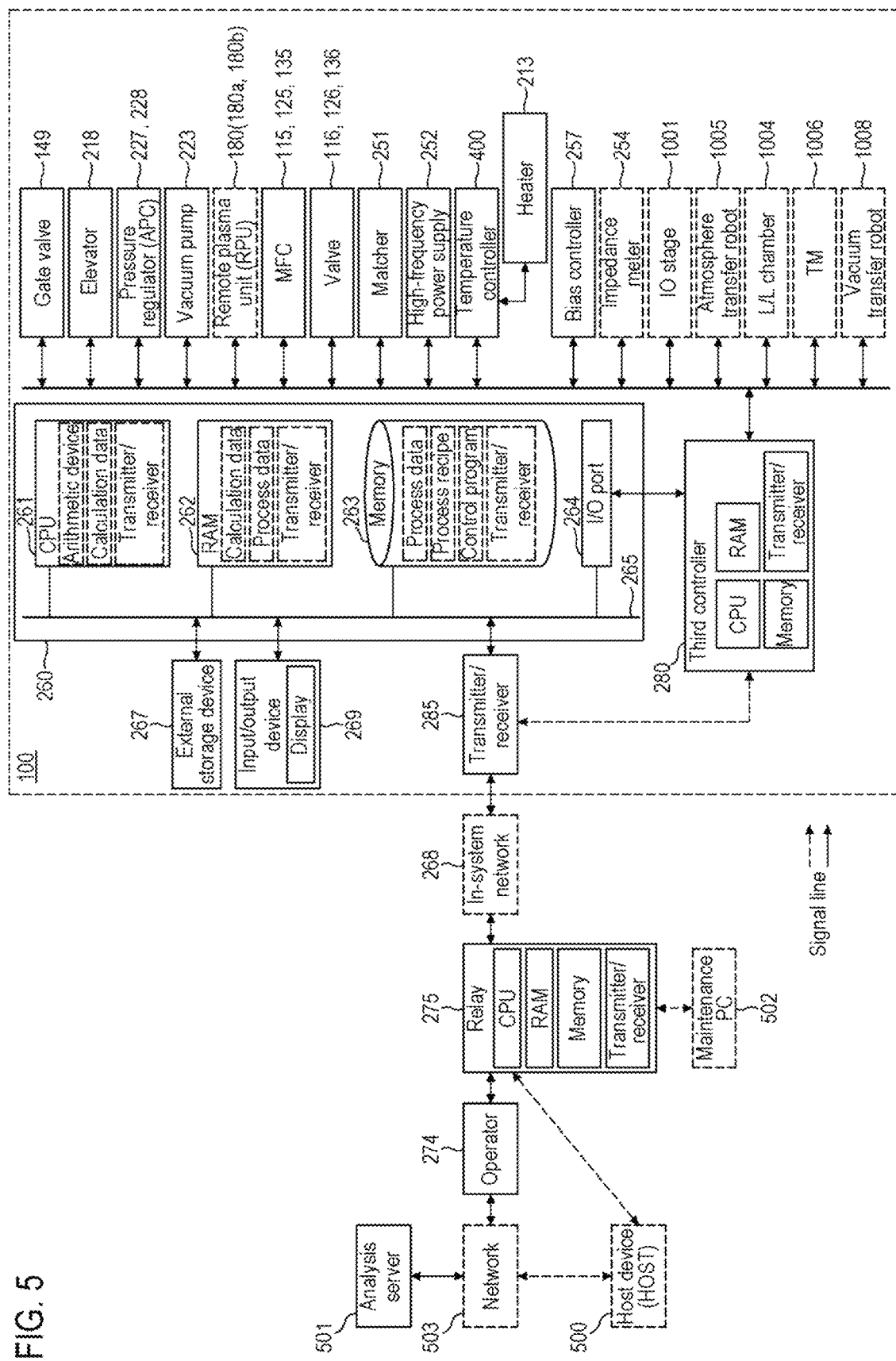
FIG. 5 is a schematic configuration diagram of a controller according to one or more embodiments.

A schematic configuration of a substrate processing system according to one or more embodiments will be described with reference to FIGS. 1, 2, 3, 4, and 5. FIG. 1 is a view showing an example of the schematic configuration of a network in the substrate processing system according to the present embodiments. FIG. 2 is an example of the configuration of the substrate processing system. FIG. 3 is a cross-sectional view showing the schematic configuration of a substrate processing apparatus according to the present embodiments. FIG. 4 is a schematic configuration diagram of a gas supply system of the substrate processing apparatus according to the present embodiments. FIG. 5 is a schematic configuration diagram showing a connection relationship between a first controller 260 and each part installed in the substrate processing apparatus.

As shown in FIG. 1, the substrate processing system 1000 includes a plurality of substrate processing apparatuses 100 (for example, 100*a*, 100*b*, 100*c*, and 100*d*). Each substrate processing apparatus 100 includes a first controller 260 (260*a*, 260*b*, 260*c*, and 260*d*), a third controller 280 (280*a*, 280*b*, 280*c*, and 280*d*), and a data transmitter/receiver 285 (285*a* 285*b*, 285*c*, and 285*d*). The first controller 260 is configured to be able to perform the operation of each part of the substrate processing apparatus 100 via the third controller 280. In addition, the first controller 260 is configured to be able to communicate with a relay 275, a second controller (operator) 274, a first controller 260 of another substrate processing apparatus 100, or the like, via the data transmitter/receiver 285 and an in-system network 268 connected to the data transmitter/receiver 285. The third controller 280 is configured to be able to control the operation of each part installed in the substrate processing apparatus 100. The first controller 260, the third controller 280, and the data transmitter/receiver 285 are configured to be able to communicate with each other.

Next, the schematic configuration of the substrate processing system 1000 will be described with reference to FIG. 2.

(2) Configuration of Substrate Processing System

The substrate processing system 1000 includes at least the substrate processing apparatus 100 (for example, 100*a*, 100*b*, 100*c*, and 100*d*). Further, as shown in FIG. 2, the substrate processing system 1000 may include an IO stage 1001, an atmosphere transfer chamber 1003, a load lock (L/L) chamber 1004, a vacuum transfer chamber 1006, etc., each of which will be described below. In the description of FIG. 2, a right direction corresponds to the X1 direction, a left direction corresponds to the X2 direction, a front direction corresponds to the Y1 direction, and a rear direction corresponds to the Y2 direction.

(Atmosphere Transfer Chamber and IO Stage)

The IO stage (load port) 1001 is provided in front of the substrate processing system 1000. A plurality of pods 1002 is mounted on the IO stage 1001. Each pod 1002 is used as a carrier for transferring substrates 200. The pod 1002 is configured to store a plurality of unprocessed substrates 200 and processed substrates 200 in a horizontal posture in the pod 1002.

The pod 1002 is transferred to the IO stage 1001 by a transfer robot (not shown) that transfers the pod.

The IO stage 1001 is adjacent to the atmosphere transfer chamber 1003. The load lock chamber 1004, which will be described later, is connected to the atmosphere transfer chamber 1003 at a side different from the IO stage 1001.

An atmosphere transfer robot 1005 serving as a first transfer robot that transfers the substrate 200 is provided in the atmosphere transfer chamber 1003.

(Load Lock (L/L) Chamber)

The load lock chamber 1004 is adjacent to the atmosphere transfer chamber 1003. Since the internal pressure of the L/L chamber 1004 varies according to the pressure of the atmosphere transfer chamber 1003 and the pressure of the vacuum transfer chamber 1006, a structure of the L/L chamber 1004 is configured to withstand a negative pressure.

(Vacuum Transfer Chamber)

Each of the plurality of substrate processing apparatuses 100 includes the vacuum transfer chamber (transfer module: TM) 1006 as a transfer chamber that becomes a transfer space in which the substrate 200 is transferred under a negative pressure. A housing 1007 forming the TM 1006 is formed in a pentagonal shape in a plan view, and the L/L chamber 1004 and the substrate processing apparatuses 100 for processing the substrate 200 are respectively connected to the sides of the pentagon. A vacuum transfer robot 1008 serving as a second transfer robot that transfers (transports) the substrate 200 under a negative pressure is provided at substantially the central portion of the TM 1006. Although the vacuum transfer chamber 1006 has a pentagonal shape here, it may have a polygonal shape such as a quadrangle or a hexagon.

The vacuum transfer robot 1008 provided in the TM 1006 includes two arms 1009 and 1010 that can operate independently. The vacuum transfer robot 1008 is controlled by the above-mentioned controller 260.

A gate valve (GV) 149 is installed in each substrate processing apparatus 100, as shown in FIG. 2. Specifically, a gate valve 149*a* is installed between a substrate processing apparatus 100*a* and the TM 1006, and a GV 149*b* is installed between a substrate processing apparatus 100*b* and the TM 1006. A GV 149*c* is installed between a substrate processing apparatus 100*c* and the TM 1006, and a GV 149*d* is installed between a substrate processing apparatus 100*d* and the TM 1006.

By opening/closing the TM 1006 by each GV 149, the substrate 200 can be taken in and out through a substrate loading/unloading port 1480 installed in each substrate processing apparatus 100.

Next, the schematic configuration of the substrate processing apparatus 100 will be described with reference to FIG. 3.

(3) Configuration of Substrate Processing Apparatus

The substrate processing apparatus 100 is, for example, configured to form an insulating film on the substrate 200, and is configured as a single-wafer type substrate processing apparatus as shown in FIG. 3. Here, the substrate processing apparatus 100*a* (100) will be described. The other substrate processing apparatuses 100*b*, 100*c*, and 100*d* may include the same configuration, and explanation thereof may be omitted. Each part installed in the substrate processing apparatus 100 is configured as one of process performing parts that process the substrate 200.

As shown in FIG. 3, the substrate processing apparatus 100 includes a process container 202. The process container 202 is configured as, for example, a flat closed container having a circular horizontal cross section. The process container 202 includes, for example, a metal material such as aluminum (Al) or stainless steel (SUS), or quartz. A transport chamber 203 and a process chamber 201 for processing a substrate 200 such as a silicon wafer as a substrate are formed in the process container 202. The process container 202 includes an upper container 202*a* and a lower container 202*b*. A partition 204 is installed between the upper container 202*a* and the lower container 202*b*. A space surrounded by the upper container 202*a* and above the partition 204 is referred to as a process chamber 201. In addition, a space surrounded by the lower container 202*b* and near the gate valve 149 is referred to as the transport chamber 203.

The substrate loading/unloading port 1480 adjacent to the gate valve 149 is installed at the side surface of the lower container 202*b*, and the substrate 200 is moved between a transfer chamber (not shown) and the transport chamber 203 via the substrate loading/unloading port 1480. A plurality of lift pins 207 are installed at the bottom portion of the lower container 202*b*. Further, the lower container 202*b* is grounded.

A substrate support 210 that supports the substrate 200 is installed in the process chamber 201. The substrate support 210 mainly includes a mounting surface 211 on which the substrate 200 is mounted, a substrate mounting table 212 including the mounting surface 211 on its surface, and a heater 213 serving as a heating part. Through-holes 214 through which the lift pins 207 penetrate are installed at the substrate mounting table 212 at positions corresponding to the lift pins 207, respectively. Further, the substrate mounting table 212 may include a bias electrode 256 for applying a bias to the substrate 200 or the process chamber 201. Here, a temperature controller 400 is connected to the heater 213, and the temperature of the heater 213 is controlled by the temperature controller 400. The temperature information of the heater 213 can be transmitted from the temperature controller 400 to the third controller 280. The bias electrode 256 is connected to a bias controller 257 by which the bias can be adjusted. Further, the bias controller 257 is configured to be able to exchange bias data with the third controller 280.

The substrate mounting table 212 is supported by a shaft 217. The shaft 217 penetrates the bottom of the process container 202 and is connected to an elevator 218 outside the process container 202. By operating the elevator 218 to move the shaft 217 and the substrate mounting table 212 up/down, it is possible to move the substrate 200 mounted on the substrate mounting surface 211 up/down. A periphery of the lower end portion of the shaft 217 is covered with a bellows 219, whereby an interior of the process chamber 201 is kept hermetically sealed. The elevator 218 may be configured to be able to exchange height data (position data) of the substrate mounting table 212 with the third controller 280. The substrate mounting table 212 can be set to at least two or more positions, for example, a first process position and a second process position. The first process position and the second process position are each configured to be adjustable.

The substrate mounting table 212 is moved to a wafer transfer position at the time of transfer of the substrate 200, and is moved to the first process position (wafer process position) indicated by a solid line in FIG. 3 at the time of first process of the substrate 200. Further, the substrate mounting table 212 is moved to the second process position indicated by a broken line in FIG. 3 at the time of second process. The wafer transfer position is a position at which the upper ends of the lift pins 207 protrude from the upper surface of the substrate mounting surface 211.

Specifically, when the substrate mounting table 212 is lowered to the wafer transfer position, the upper ends of the lift pins 207 protrude from the upper surface of the substrate mounting surface 211, so that the lift pins 207 support the substrate 200 from below. Further, when the substrate mounting table 212 is raised to the wafer process position, the lift pins 207 are buried from the upper surface of the substrate mounting surface 211, so that the substrate mounting surface 211 supports the substrate 200 from below. Since the lift pins 207 are in direct contact with the substrate 200, the lift pins 207 may include a material such as quartz or alumina.

(Exhaust System)

A first exhaust port 221 serving as a first exhauster for exhausting the atmosphere of the process chamber 201 is installed at the side surface of the process chamber 201 (the upper container 202a). An exhaust pipe 224a is connected to the first exhaust port 221, and a vacuum pump 223 and a pressure regulator 227 such as an APC for controlling the interior of the process chamber 201 to a predetermined pressure are sequentially connected in series to the exhaust pipe 224a. A first exhaust system (exhaust line) mainly includes the first exhaust port 221, the exhaust pipe 224a, and the pressure regulator 227. The vacuum pump 223 may be included in the first exhaust system. A second exhaust port 1481 for exhausting the atmosphere of the transport chamber 203 is installed at the side surface of the transport chamber 203. An exhaust pipe 148 is installed at the second exhaust port 1481. A pressure regulator 228 is installed at the exhaust pipe 148 so that the internal pressure of the transport chamber 203 can be exhausted to a predetermined pressure. Further, the internal atmosphere of the process chamber 201 can be exhausted through the transport chamber 203. Further, the pressure regulator 227 is configured to be able to exchange pressure data or valve opening degree data with the third controller 280. Further, the vacuum pump 223 is configured to be able to transmit ON/OFF data of the pump, load data, or the like to the third controller 280.

(Gas Introduction Port)

A lid 231 is installed at the upper surface (ceiling wall) of a shower head 234 installed at an upper portion of the process chamber 201. The lid 231 includes a gas introduction port 241 for supplying various gases into the process chamber 201. The configuration of each gas supplier connected to the gas introduction port 241 which is a gas supplier will be described later.

(Gas Disperser)

The shower head 234 serving as a gas disperser includes a buffer chamber 232 and a dispersion plate 244a. The dispersion plate 244a may be configured as a first electrode 244b serving as a first activator. The dispersion plate 244a includes a plurality of holes 234a for supplying gas to the substrate 200 in a distributed manner. The shower head 234 is installed between the gas introduction port 241 and the process chamber 201. Gas introduced from the gas introduction port 241 is supplied to the buffer chamber 232 (also referred to as a disperser) of the shower head 234, and is supplied to the process chamber 201 via the holes 234a.

When the dispersion plate 244a is configured as the first electrode 244b, the first electrode 244b includes a conductive metal and is configured as a portion of the activator (exciter) for exciting gas in the process chamber 201. An electromagnetic wave (high-frequency power or a microwave) can be supplied to the first electrode 244b. When the lid 231 includes a conductive member, an insulating block 233 is installed between the lid 231 and the first electrode 244b to insulate the lid 231 from the first electrode 244b.

(Activator (Plasma Generator))

A configuration in a case where the first electrode 244b serving as the activator is installed will be described. A matcher 251 and a high-frequency power supply 252 are connected to the first electrode 244b serving as the activator so as to be able to supply an electromagnetic wave (high-frequency power or a microwave). This enables gas supplied into the process chamber 201 to be activated. In addition, the first electrode 244b is configured to be able to generate capacitively-coupled plasma. Specifically, the first electrode 244b is formed in a conductive plate shape and is configured to be supported by the upper container 202a. The activator includes at least the first electrode 244b, the matcher 251, and the high-frequency power supply 252. An impedance meter 254 may be installed between the first electrode 244b and the high-frequency power supply 252. By including the impedance meter 254, the matcher 251 and the high-frequency power supply 252 can be feedback-controlled based on the measured impedance. Further, the high-frequency power supply 252 is configured to be able to exchange power data with the third controller 280, the matcher 251 is configured to be able to exchange matching data (traveling wave data and reflected wave data) with the third controller 280, and the impedance meter 254 is configured to be able to exchange impedance data with the third controller 280.

(Supply System)

A common gas supply pipe 242 is connected to the gas introduction port 241. The common gas supply pipe 242 is in fluid communication with the interior of the pipe, and gas supplied from the common gas supply pipe 242 is supplied into the shower head 234 via the gas introduction port 241.

A gas supplier shown in FIG. 4 is connected to the common gas supply pipe 242. A first gas supply pipe 113a, a second gas supply pipe 123a, and a third gas supply pipe 133a are connected to the gas supplier.

A first element-containing gas (first process gas) is mainly supplied from a first gas supplier including the first gas supply pipe 113a. A second element-containing gas (second process gas) is mainly supplied from a second gas supplier including the second gas supply pipe 123a. A third element-containing gas is mainly supplied from a third gas supplier including the third gas supply pipe 133a.

(First Gas Supplier)

The first gas supply pipe 113a includes a first gas supply source 113, a mass flow controller (MFC) 115 which is a flow rate controller (flow rate control part), and a valve 116 which is an opening/closing valve in this order from an upstream direction.

The first element-containing gas is supplied from the first gas supply pipe 113a to the shower head 234 via the MFC 115, the valve 116, and the common gas supply pipe 242.

The first element-containing gas is one of process gases. The first element-containing gas is gas containing silicon (Si), for example, such as hexachlorodisilane ($Si_2Cl_6$, abbreviation: HCDS) gas or the like.

The first gas supplier mainly includes the first gas supply pipe 113a, the MFC 115, and the valve 116.

Further, one or both of the first gas supply source 113 and a remote plasma unit (RPU) 180a that activates the first gas may be included in the first gas supplier.

(Second Gas Supplier)

The second gas supply pipe 123a includes a second gas supply source 123, a MFC 125, and a valve 126 in this order from an upstream direction.

The second element-containing gas is supplied from the second gas supply pipe 123a into the shower head 234 via the MFC 125, the valve 126, and the common gas supply pipe 242.

The second element-containing gas is one of process gases. The second element-containing gas is gas containing nitrogen (N), for example, such as ammonia ($NH_3$) gas, nitrogen ($N_2$) gas, or the like.

The second gas supplier mainly includes the second gas supply pipe 123a, the MFC 125, and the valve 126.

Further, one or both of the second gas supply source 123 and a remote plasma unit (RPU) 180b that activates the second gas may be included in the second gas supplier.

(Third Gas Supplier)

The third gas supply pipe 133a includes a third gas supply source 133, an MFC 135, and a valve 136 in order from an upstream direction.

Inert gas is supplied from the third gas supply pipe 133a to the shower head 234 via the MFC 135, the valve 136, and the common gas supply pipe 242.

The inert gas is gas that does not easily react with the first gas. The inert gas is, for example, nitrogen ($N_2$) gas, argon (Ar) gas, helium (He) gas, or the like.

The third gas supplier mainly includes the third gas supply pipe 133a, the MFC 135, and the valve 136.

Here, the MFCs and the valves that form the first gas supplier, the second gas supplier, and the third gas supplier, respectively, are configured to be able to exchange the following data with the third controller 280. MFC: flow rate data, and Valve: opening degree data. A vaporizer and an RPU may be included in the first gas supplier or the second gas supplier. The vaporizer and the RPU are also configured to be able to exchange the following data with the third controller 280. Vaporizer: vaporization amount data, and RPU: electric power data.

(Controller)

Next, a controller will be described. As shown in FIGS. 1 and 5, the substrate processing apparatus 100 includes the first controller 260 and the third controller 280 as the controller for controlling the operations of each part of the substrate processing apparatus 100.

FIG. 5 shows a schematic configuration diagram of the controller.

(First Controller)

The first controller 260 is configured as a computer including a CPU (Central Processing Unit) 261, a RAM (Random Access Memory) 262, a memory 263, and an I/O port 264. The RAM 262, the memory 263, and the I/O port 264 are configured to be able to exchange data with the CPU 261 via an internal bus 265. A transmitter/receiver 285, an external storage device 267, an input/output device 269, or the like are connected to the internal bus 265. At least one selected from the group of the transmitter/receiver 285, the external storage device 267, and the input/output device 269 may be included in the first controller 260.

The memory 263 includes, for example, a flash memory, an HDD (Hard Disk Drive), or the like. Device data are recorded in the memory 263 in a readable manner.

The device data includes at least one selected from the group of the following data types. For example, a control program for controlling the operation of the substrate processing apparatus, a process recipe in which a procedure or conditions of substrate processing to be described later are described, schedule data, process data, load data (operation data), regular inspection data, device connection data, internal connection data, wafer 200 data, alarm data, importance level table data for each data type, interrupt enable/disable table data for each data type, transmission interval table data, transmission destination setting table data, processing data or calculation data, which are generated in the process of setting a process recipe used for processing the substrate 200, or the like.

The process recipe is combined to obtain a predetermined result by causing the first controller 260 to execute the respective procedures in the substrate-processing process to be described later, and function as a program. Hereinafter, the process recipe, the control program, the above-mentioned data, or the like are collectively referred to simply as a program. In the present disclosure, the term "program" may include the process recipe, the control program, or both the process recipe and the control program.

Here, the load data refers to at least one selected from the group of the load state of at least one selected from the group of the CPU 261, the RAM 262, and the memory 263 installed at the first controller 260, the number of errors, the operating time, the temperature, each network band data, or the like. The load data may include the same type of data of the second controller 274, the relay 275, the third controller 280, or the like, as well as the first controller 260.

The network band data includes at least one selected from the group of data indicating a band occupancy rate of the in-system network 268, transmission speed data of the data transmitter/receiver 285, transmission speed data of the second controller 274, reception speed data of the second controller 274, transmission speed data of the relay 275, reception speed data of the relay 275, or the like.

The process data is flow rate data of gas supplied into the process chamber 201, internal pressure data of the process chamber 201, temperature data of the substrate support 210 (the heater 213), valve opening degree data of the pressure regulator 227, or the like.

The wafer 200 data is data associated with the wafer 200 transferred to the substrate processing apparatus 100.

The schedule data is data indicating a processing schedule of the substrate 200.

Next, each table data will be described based on FIGS. 6 to 10.

(Importance Level Table Data)

The importance level table data for each data type is a table shown in FIG. 6, and is table data in which the importance level for each data type is set. In FIG. 6, the importance level is represented by 1, 2, 3, . . . , N (N is a natural number), and is set such that a value having a smaller natural number gives a higher importance level. For example, data types that may affect the operation of the apparatus or substrate processing, such as alarm data, process data, or the like, are set to have a higher importance level. Data types that may not be always checked, such as device operation data, regular inspection data, or the like, are set to have a lower importance level. Further, this importance level is configured to be able to be set and changed as appropriate by a user of the substrate processing apparatus or a user of the substrate processing system.

(Interrupt Enable/Disable Table Data)

The interrupt enable/disable table data for each data type is a table shown in FIG. 7, and is table data in which the interrupt enable/disable is set for each data type. In the interrupt enable/disable table data, the interrupt enable/disable ("Yes"/"No") is set for each data type. Here, each data is transmitted at a predetermined transmission interval. For example, a case in which the interrupt enable ("Yes") is set for device operation data will be described. In this case, when alarm data is generated during transmission of the device operation data at predetermined intervals, the transmission of the device operation data is temporarily stopped and the alarm data is preferentially transmitted. That is, an interruption process of the transmission of the alarm data is performed during the transmission of the device operation data. When the interrupt disable ("No") is set, such temporary stop of the transmission is not performed. Here, the interrupt enable/disable is set for each data type, but the interrupt enable/disable may be set for each data importance level.

(Transmission Interval Table Data)

The transmission interval table data is illustrated, as an example, in a table shown in FIG. 8, and is a table in which a transmission interval is set for each load level and for each data type (data importance level). The transmission interval is set for at least one selected from the group of data type (data importance level) and load level. FIG. 8 shows a table set for both the data type and the load level. In FIG. 8, the transmission interval is set to 1, 2, 3, . . . , X (X is a natural number). A narrower transmission interval is set for a smaller X, and a wider transmission interval is set for a larger X. Here, the narrower transmission interval means that the transmission is closer to real-time communication. For example, the transmission interval is set to "1" regardless of the load level for the alarm data (importance level 1). In this way, data having high importance level can be transmitted at the same interval regardless of the load level. For example, the transmission interval is set to be changed according to the load level for the regular inspection data (importance level 4). The transmission interval may be set by the user of the substrate processing apparatus 100 or the user of the substrate processing system 1000. When the user can set the transmission interval, the operator 274 or the input/output device 269 is configured to be able to display the table.

Here, the load level is set based on the above-mentioned load data. When the load data includes the load state data of the CPU 261, for example, the load level can be set as follows. Load level 1 is set when the load data is 0 to 25%. Load level 2 is set when the load data is 26 to 50%. Load level 3 is set when the load data is 51 to 75%. Load level 4 is set when the load data is 76 to 100%. In this way, the load level can be set according to the percentage of the load data.

(Transmission Destination Setting Table Data)

The transmission destination setting table data is illustrated, as an example, in a table shown in FIGS. 9 and 10, and is a table in which the transmission destination is set for each data type. The transmission destination setting table in FIG. 9 is a table in which the transmission destination for each data type transmitted by the first controller 260 is set. The transmission destination setting table shown in FIG. 10 is a table in which the transmission destination for each data type transmitted by the relay 275 is set. Various types of data included in the first controller 260 or the third controller 280 are transmitted to the operator 274 or the relay 275. Various types of data included in the relay 275 are transmitted to the operator 274, a host device 500, an analysis server 501, or the like. Here, there may be a plurality of transmission paths to be transmitted. Depending on the load of a network 503 on the transmission path or the load state of the transmitter/receiver of each controller, the load may be dispersed by making the transmission destination different. The transmission path (transmission destination) is determined by the transmission destination setting table. For example, in FIG. 9, data of higher importance level such as the alarm data or the process data may be set to be transmitted to both the transmission destination 1 (the operator 274) and the transmission destination 2 (the relay 275). Data of lower importance level such as the device operation data or the regular inspection data may be set be transmitted to the transmission destination 2 (the relay 275) without being transmitted to the transmission destination 1 (the operator 274) where the load is concentrated. By setting in this way, it becomes possible to suppress the concentration of the load on the operator 274. Further, as shown in FIG. 10, with respect to the data transmitted from the relay 275, the transmission destination may be set according to the importance level of the data or the use of the data at the transmission destination.

Each data or each table are recorded in the memory of each controller. The operator 274 or the input/output device 269 may be notified of a screen showing the same contents. Here, the notification means displaying the contents on the screen or transmitting the contents to the screen. In addition, when the contents are configured to be displayed on the screen, each table is configured to be able to rewrite data of each table on the screen. Each controller controls the transmitter/receiver included in each controller based on the setting of each table data. Further, each table may be acquired by receiving the table from the host device (HOST) 500 or the analysis server 501.

The CPU 261 as an arithmetic device is configured to read and execute the control program from the memory 263 and read the process recipe from the memory 263 in response to input of an operation command from the input/output device 269 or the like. Further, the CPU 261 is configured to be compare/calculate a set value input from the transmitter/receiver 285 and the control data or the process recipe stored in the memory 263 to calculate the calculation data. Further, the CPU 261 is configured to be able to execute a process of determining corresponding process data (process recipe) from the calculation data. The calculation data is exchanged with the third controller 280 to be described later via at least one selected from the group of the internal bus 265, the I/O port 264, and the transmitter/receiver 285. Each part is controlled by the transmitter/receiver in the CPU 261 transmitting/receiving control information according to the contents of the process recipe.

The RAM 262 is configured as a memory area (work area) in which programs read by the CPU 261, data such as calculation data, process data, or the like are temporarily stored.

The I/O port 264 is connected to the third controller 280 to be described later.

The input/output device 269 includes a display part configured as a display or a touch panel.

The transmitter/receiver 285 is configured to be able to communicate with the operator 274 via the in-system network 268, and the relay 275 is installed between the operator 274 and the transmitter/receiver 285.

(Second Controller (Operator))

The second controller (operator) 274 is configured as an operator that operates the substrate processing system 1000. The second controller 274 is configured to be able to control each of the substrate processing apparatuses 100 included in the substrate processing system 1000. The second controller 274 is configured to be able to communicate with the host device (HOST) 500, the analysis server 501, and one or both of the first controller 260 and the third controller 280 via the network 503. Further, the second controller 274 may be configured to be able to be connected to a maintenance PC 502.

(Third Controller)

The third controller 280 is connected to each part (process performing part) of the substrate processing apparatus and is configured to be able to collect information (data) of each part. For example, the third controller 280 is connected to the gate valve 149, the elevator 218, the temperature controller 400, the pressure regulators 227 and 228, the vacuum pump 223, the matcher 251, the high-frequency power supply 252, the MFCs 115, 125, and 135, the valves 116, 126, and 136, the bias controller 257, or the like. The third controller 280 may also be connected to the impedance meter 254, the RPU 180, or the like. Further, the third controller 280 may be connected to one or both of the transmitter/receiver 285 and the network 268. Further, the third controller 280 may be connected to the IO stage 1001, the atmosphere transfer robot 1005, the L/L chamber 1004, the TM 1006, the vacuum transfer robot 1008, or the like.

The third controller 280 is configured to control the opening/closing operation of the gate valve 149, the moving up/down operation of the elevator 218, the operation of supplying power to the temperature controller 400, the temperature regulating operation of the substrate mounting table 212 by the temperature controller 400, the pressure regulating operation of the pressure regulators 227 and 228, the on/off control of the vacuum pump 223, the gas flow rate control operation of the MFCs 115, 125, and 135, the gas activating operation of the RPUs 180a and 180b, the gas on/off control by the valves 116, 126, and 136, the power matching operation of matcher 251, the power control of the high-frequency power supply 252, the control operation of the bias controller 257, the matching operation of the matcher 251 based on measurement data measured by the impedance meter 254, the power control operation of the high-frequency power supply 252, or the like, according to the process recipe data calculated by the first controller 260.

The first controller 260, the relay 275, the third controller 280, and the operator 274 are not limited to being configured as a dedicated computer but may be configured as a general-purpose computer. For example, the controller 260 according to the present embodiments can be configured by preparing the external storage device 267 (for example, a magnetic tape, a magnetic disk such as a flexible disk or a hard disk, an optical disk such as a CD or a DVD, a magneto-optical disk such as an MO, or a semiconductor memory such as a USB memory or a memory card) storing the above-mentioned program (data) and installing a program in the general-purpose computer using the external storage device 267. The means for supplying (recording) the program to the computer is not limited to the case of supplying the program via the external storage device 267. For example, a communication means such as the transmitter/receiver 285 or the network 268 (Internet or a dedicated line) may be used to supply the program (data) without using the external storage device 267. The memory 263 and the external storage device 267 are configured as a non-transitory computer-readable recording medium. Hereinafter, these are collectively referred to as a recording medium. When the term "recording medium" is used in the present disclosure, it may include the memory 263, the external storage device 267, or both of the memory 263 and the external storage device 267.

(Relay 275)

The relay of various data transmitted and received between the substrate processing apparatus 100 and the second controller (operator) 274 is configured to be executable. The relay 275 is configured to be able to receive device data from the first controller 260 or other connected devices at predetermined intervals. Further, the relay 275 is configured to be able to transmit data to the second controller 274 or other connected devices at predetermined intervals. Further, the relay 275 performs control of the transmission interval of various data and storage (recording) of various data sent from the substrate processing apparatus 100 to the second controller (operator) 274 according to the determination of the load level and the contents set in various table data. That is, the relay 275 is configured to make the reception interval of the data to be received different from the transmission interval of the data to be transmitted. Here, the transmission interval may be set as a transmission speed (used band). When the transmission speed is set, the band of the in-system network 268 is always used, and therefore, the transmission interval may be set. The relay 275 includes a memory and is configured to be able to store (record) the received data.

The term "connection" used in the present disclosure includes not only the meaning that parts are connected by a physical cable, but also the meaning that signals (electronic data) of parts can be directly or indirectly transmitted/received.

(2) Substrate-Processing Process

Figure 11:
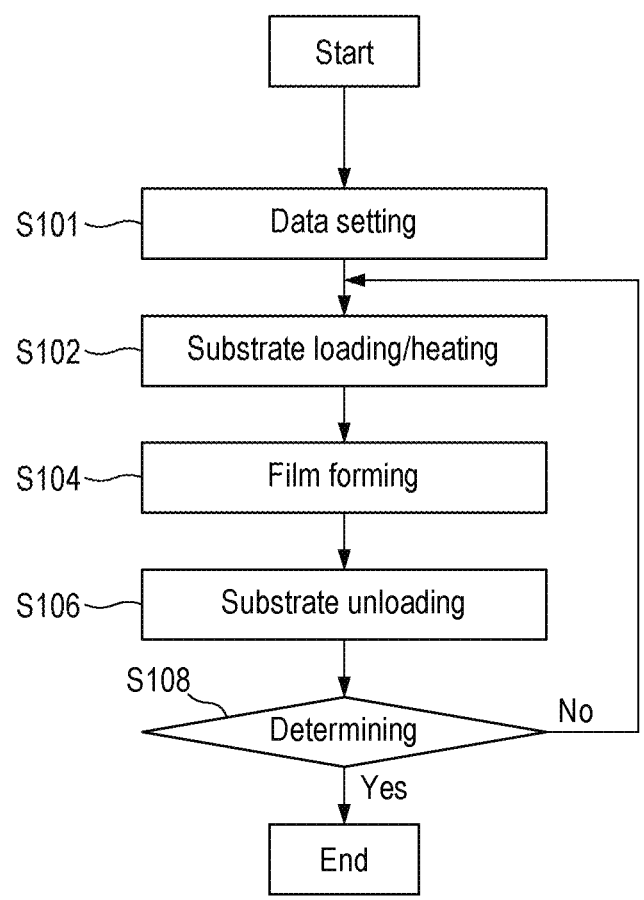
FIG. 11 shows an example of a flow chart of substrate processing according to one or more embodiments.

Next, as one of processes of manufacturing a semiconductor device, an example of a process of forming an insulating film on a substrate will be described with reference to FIG. 11 which is a process flow of the above-described substrate processing apparatus 100. Here, as the insulating film, for example, a silicon nitride (SiN) film as a nitride film is formed. In addition, in the following description, the process of this manufacturing process and the operation of each part are controlled by at least one selected from the group of the first controller 260 and the third controller 280.

The substrate-processing process will be described below.
(Data Setting: S101)

First, data setting S101 will be described. In the data setting S101, an interval at which data are transmitted is set in each controller. When the second controller 274 includes each table data, the second controller 274 transmits each table data to at least one selected from the group of the relay 275, the first controller 260, and the third controller 280. The relay 275, the first controller 260, and the third controller 280 change the transmission settings of the transmitter/receiver based on the received table data.
(Substrate Loading/Heating: S102)

Next, substrate loading/heating (S102) will be described. In the substrate loading/heating (S102), the wafer 200 is loaded from the TM 1006 into the container 202 using the vacuum transfer robot 1008. Then, after the wafer 200 is loaded into the container 202, the vacuum transfer robot 1008 is evacuated to the outside of the container 202, and the gate valve 149 is closed to seal the interior of the container 202. After that, by raising the substrate mounting table 212, the wafer 200 is mounted on the substrate mounting surface 211 installed at the substrate mounting table 212, and by further raising the substrate mounting table 212, the wafer 200 is raised to the above-mentioned process position (substrate process position) in the process chamber 201.

After the wafer 200 is loaded into the transport chamber 203, and when the wafer 200 is raised to the process position in the process chamber 201, the valve of the pressure regulator 228 is closed. Thereby, the exhaust of the transport chamber 203 from the exhaust pipe 148 is completed. On the other hand, the APC 227 is opened to allow the process chamber 201 in fluid communication with the vacuum pump 223. The APC 227 controls the exhaust flow rate of the process chamber 201 by the vacuum pump 223 by adjusting the conductance of the exhaust pipe 224a, so that the process space of the process chamber 201 is maintained at a predetermined pressure (for example, high vacuum of $10^{-5}$ to $10^{-1}$ Pa).

In this way, in the substrate loading/heating (S102), the interior of the process chamber 201 is controlled to have a predetermined pressure, and the surface of the wafer 200 is controlled to have a predetermined temperature. The temperature is, for example, room temperature or higher and 500 degrees C. or lower, or room temperature or higher and 400 degrees C. or lower in some embodiments. The pressure may be, for example, 50 to 5000 Pa.
(Film Forming: S104)

Subsequently, film forming (S104) will be described. After the wafer 200 is positioned at the process position in the process chamber 201, the film forming (S104) is performed in the substrate processing apparatus 100. The film forming (S104) is forming a thin film on the wafer 200 by supplying a first process gas (first element-containing gas) and a second process gas (second element-containing gas), which are different from each other, to the process chamber 201 according to the process recipe. In the film forming (S104), the first process gas and the second process gas may be simultaneously present in the process chamber 201 to perform a CVD (chemical vapor deposition) process, or a cyclic (alternate supply) process of repeatedly supplying the first process gas and the second process gas alternately may be performed. Further, when processing the second process gas in a plasma state, the RPU 180b may be activated. Further, substrate process such as heat process, modifying process, or the like which supplies either the first process gas or the second process gas may be performed.
(Substrate Unloading: S106)

Next, substrate unloading (S106) will be described. After the film forming (S104) is completed, the substrate unloading (S106) is performed in the substrate processing apparatus 100. In the substrate unloading (S106), the processed wafer 200 is unloaded to the outside of the container 202 in a transfer procedure reverse to the transfer procedure of the above-described substrate loading/heating (S102). The wafer 200 may be unloaded without being cooled.
(Determining: S108)

Next, determining (S108) will be described. When the substrate unloading (S106) is completed, whether one cycle including the above-described series of operations (S102 to S106) has been performed a predetermined number of times or not is determined in the substrate processing apparatus 100. That is, it is determined whether a predetermined number of wafers 200 have been processed or not. When the one cycle has not been performed a predetermined number of times, the one cycle from the substrate loading/heating (S102) to the substrate unloading (S106) is repeated. On the other hand, when the one cycle has been performed a predetermined number of times, the substrate-processing process is ended.

Figure 12:
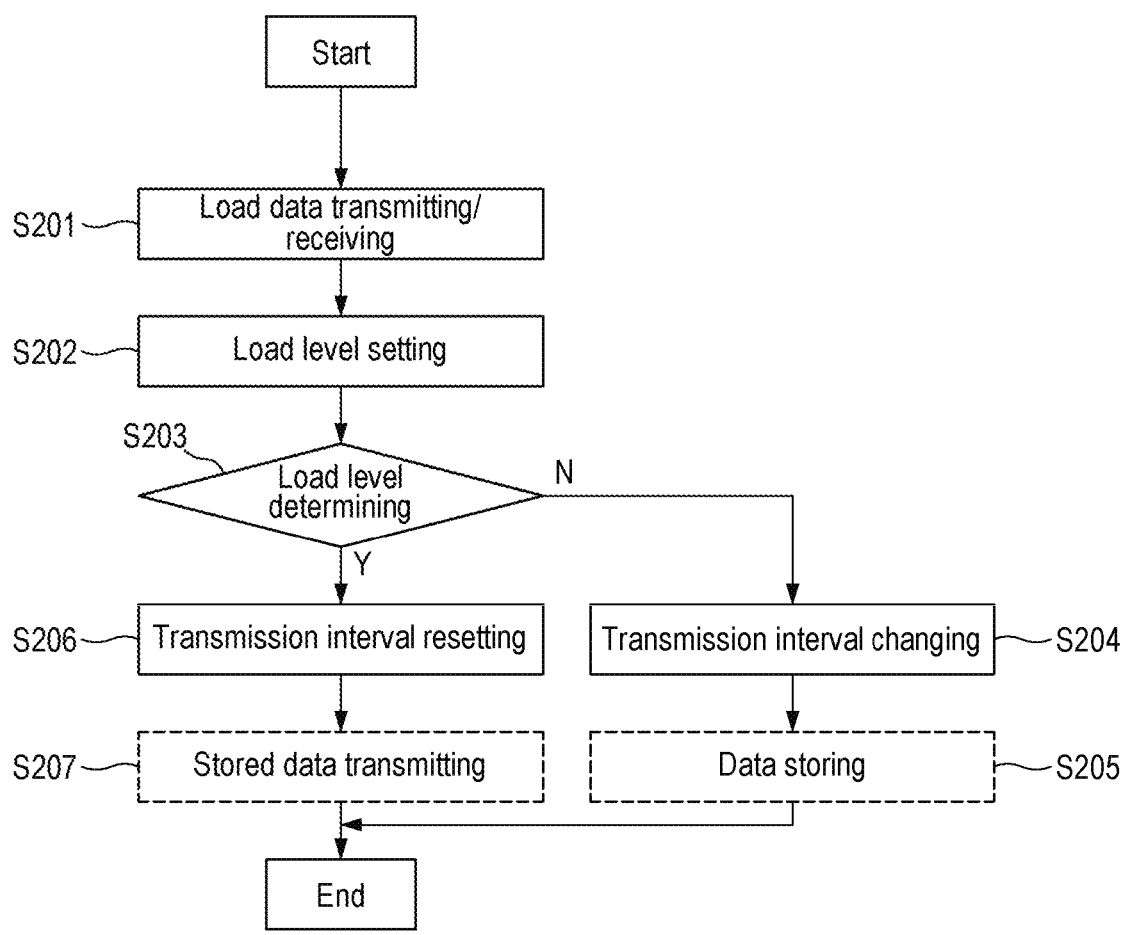
FIG. 12 shows an example of a flow chart of a transmission interval-changing process based on load data according to one or more embodiments.

The following process including transmission interval changing, shown in FIG. 12, is performed either before or after this substrate-processing process. The following process may be performed during the substrate processing or may be performed in parallel with the substrate-processing process for a predetermined period.
(Load Data Transmitting/Receiving S201)

A process of sharing the latest load data stored in each controller (the first controller 260, the second controller 274, and the third controller 280) and the relay 275 between the controllers and the relay is performed. Specifically, the load data stored in each controller is transmitted to the relay 275. The relay 275 performs receiving the load data stored in each controller.
(Load Level Setting S202)

Next, load level setting S202 is performed. The setting of the load level is calculated by a CPU included in the relay 275. Here, the load level of each controller or the system network 268 is determined based on the received load data. For example, the load level of the second controller 274 is set to a corresponding level in a range of 1 to X.
(Load Level Determining S203)

It is determined whether the load level of each controller and the system network 268 is a prescribed value or not for at least one selected from the group of each controller and the system network 268. When the load level is a prescribed value, a Y ("YES") determination is made. When it is not a prescribed value, an N ("NO") determination is made. In the case of Y determination, transmission interval resetting S206 can be performed. In the case of N determination, transmission interval changing S204 can be performed. For example, when the prescribed value of the load level of the second controller 274 is set to "1," it is determined whether the load level set in the load level setting S202 is "1" or not.
(Transmission Interval Changing S204)

Next, the transmission interval changing S204, which is performed after the N determination is made in the load level determining S203, will be described. In this operation, the transmission interval data corresponding to the load level set in the load level setting S202 is read and the transmission interval for each data type transmitted from the relay 275 to the second controller 274 is set. Specifically, based on the transmission interval table shown in FIG. 8, the transmission interval data for each data type corresponding to the load level set in the load level setting S202 is read, and each controller sets the transmission interval for each data type. For example, when the load level is set to "2" in the load level setting S202, the transmission interval for each data type corresponding to the load level 2 is read. Specifically, "1" is read as the transmission interval of the alarm data. "1" is read as the transmission interval of the process data. "2" is read as the transmission interval of the device operation data. "2" is read as the transmission interval of the regular inspection data. Based on the read transmission interval data, the transmission interval for each data type transmitted from the relay 275 to the second controller 274 is set. Specifically, the transmission interval of the alarm data is set to "1," the transmission interval of the process data is set to "1," the transmission interval of the device operation data is set to "2," and the transmission interval of the regular inspection data is set to "2."

(Data Storing S205)

In the transmission interval changing S204, at least for the data type for which the transmission interval data is set to "2" or more, the data received by the relay 275 is recorded (data storage) in the memory of the relay 275.

Next, the transmission interval resetting S206 which is performed after the load level is determined to be within the prescribed value (Y determination) in the load level determining S203 will be described.

(Transmission Interval Resetting S206)

In the transmission interval resetting S206, the transmission interval data corresponding to the load level 1 is read from the transmission interval table shown in FIG. 8 and the transmission interval for each data type is set.

(Stored Data Transmitting S207)

Subsequently, stored data transmitting S207 may be performed. In the stored data transmitting S207, at least the data of which the transmission interval is set to "2" or more, and the data recorded (data storage) in the memory of the relay 275 is transmitted to the second controller 274.

In this way, a process including the transmission interval changing is performed.

In the above description, the relay 275 receives the various data transmitted from the first controller 260 (the third controller 280) at the same transmission interval, and the relay 275 transmits the various data to the second controller 274 at the set transmission interval. However, the present disclosure is not limited thereto. For example, the relay 275 may cause one or both of the first controller 260 and the third controller 280 to change the data transmission destination based on the transmission destination setting table shown in FIG. 9. For example, as shown in the table shown in FIG. 9, the first controller 260 may be set to transmit the alarm data and the process data to the transmission destination 1 (the operator 274) without passing through the transmission destination 2 (the relay 275). By transmitting the data without passing through the relay 275, it is possible to suppress data delay.

Further, in the above description, some examples in which the same transmission interval and the same transmission destination are set in the plurality of substrate processing apparatuses 100 included in the substrate processing system 1000 have been described. However, the present disclosure is not limited thereto. For example, various settings may be different for different substrate processing apparatuses 100 (100a, 100b, 100c and 100d). In the substrate processing system 1000 including the plurality of substrate processing apparatuses 100, the same process may not be executed in the substrate processing apparatuses 100. In this case, the data communication efficiency can be improved by making the settings for the substrate processing apparatuses 100 different. Further, even when the process timing of the substrate 200 differs for each substrate processing apparatus 100, one or both of the setting of the transmission destination and the setting of the transmission interval of various data may be different for each substrate processing apparatus 100. For example, since the amount of data increases during the processing of the substrate 200, a process including the above-described transmission interval changing, and the transmission destination changing may be performed at a timing when the data amount increases (the load increases).

In the above description, the transmission destination is set based on one transmission destination setting table shown in FIG. 9. However, the present disclosure is not limited thereto. For example, a plurality of transmission destination setting tables may be provided and selected according to the load level.

In the above description, the load level setting and the load level determination are performed by the relay 275. However, these operations may be performed by the second controller 274, the host device 500, the analysis server 501, or the like.

The stored data may be read from the memory of the relay 275 using the maintenance PC 502 during maintenance of the substrate processing apparatus 100 or the substrate processing system 1000. Further, the stored data may be transmitted from the relay 275 to the host device 500, the analysis server 501, or the like.

Although some embodiments of the present disclosure has been described in detail above, the present disclosure is not limited to the above-described embodiments, but various modifications can be made without departing from the spirit and scope of the present disclosure.

Although the semiconductor device-manufacturing process has been described above, the present disclosure can also be applied to other than the semiconductor device-manufacturing process. For example, the present disclosure may be applied to substrate processes such as a liquid crystal device-manufacturing process, a solar cell-manufacturing process, a light emitting device-manufacturing process, a glass substrate-processing process, a ceramic substrate-processing process, a conductive substrate-processing process, or the like.

Further, in the above description, some examples of forming a silicon nitride film by using silicon-containing gas as precursor gas and nitrogen-containing gas as reaction gas have been shown. However, the present disclosure can also be applied to film formation using another gas. For example, the present disclosure may be applied to an oxygen-containing film, a nitrogen-containing film, a carbon-containing film, a boron-containing film, a metal-containing film, a film containing a plurality of these elements, or the like. Further, examples of these films include an AlO film, a ZrO film, a HfO film, a HfAlO film, a ZrAlO film, a SiC film, a SiCN film, a SiBN film, a TiN film, a TiC film, a TiAlC film, or the like.

Moreover, in the above description, an apparatus configuration for processing one substrate in one process chamber has been shown. However, the present disclosure is not limited thereto, but may be applied to an apparatus in which a plurality of substrates are arranged horizontally or vertically.

According to some embodiments of the present disclosure, it is possible to manage a substrate processing apparatus with high efficiency.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing system comprising:
   a plurality of substrate processing apparatuses each configured to process a substrate;
   a first controller installed in each substrate processing apparatus among the plurality of substrate processing apparatuses and configured to control the substrate processing apparatus;
   a relay configured to receive a plurality of types of data from the first controller; and
   a second controller configured to receive the plurality of types of data from the relay,
   wherein the relay is configured to change a transmission interval of the plurality of types of data to the second controller according to either each type of the plurality of types of data or each first controller, or according to the each type of the plurality of types of data and the each first controller, and
   wherein the relay is configured to make a reception interval from the first controller different from the transmission interval to the second controller according to either the each type of the plurality of types of data or the each first controller, or according to the each type of the plurality of types of data and the each first controller.

2. The substrate processing system of claim 1, wherein the relay is further configured to:
   receive the plurality of types of data at a predetermined interval; and
   change the transmission interval for the each type of the plurality of types of data based on one or both of a load level of the second controller and a network load level between the relay and the second controller, and transmit the plurality of types of data to the second controller.

3. The substrate processing system of claim 2, wherein the one or both of the load level of the second controller and the network load level are determined by one or both of the relay and the second controller.

4. The substrate processing system of claim 1, wherein the relay further changes the transmission interval based on an importance level of data among the plurality of types of the data.

5. The substrate processing system of claim 1, wherein the relay is configured to transmit the plurality of types of data to each of the second controller and another controller based on a type of the plurality of types of data.

6. The substrate processing system of claim 1, wherein the relay is configured to record the plurality of types of data which is received.

7. The substrate processing system of claim 6, wherein the relay is configured to transmit the plurality of types of data, which is recorded, after a load level of the second controller falls within a prescribed value.

8. The substrate processing system of claim 1, wherein the second controller includes table data in which a type of the plurality of types of data and a transmission destination of the plurality of types of data transmitted by the first controller are recorded, and
   wherein a setting of the transmission destination of the first controller is updated based on the table data.

9. The substrate processing system of claim 2, wherein the second controller includes a plurality of table data in which a type of the plurality of types of data and a transmission destination of the plurality of types of data transmitted by the first controller are recorded, and the table data is selected based on the load level.

10. The substrate processing system of claim 1, wherein the second controller includes table data in which a type of the plurality of types of data and a transmission destination of the plurality of types of data transmitted by the first controller are recorded, and the table data is configured to be capable of being changed.

11. A method of manufacturing a semiconductor device, comprising:
    processing a substrate in each of a plurality of substrate processing apparatuses;
    receiving a plurality of types of data at a relay from a first controller installed in each of the substrate processing apparatuses;
    changing a transmission interval according to either each type of the plurality of types of data or each first controller, or according to the each type of the plurality of types of data and the each first controller, and transmitting the plurality of types of data at the transmission interval from the relay to a second controller; and
    making, by the relay, a reception interval from the first controller different from the transmission interval to the second controller according to either the each type of the plurality of types of data or the each first controller, or according to the each type of the plurality of types of data and the each first controller.

12. The method of claim 11, wherein the relay receives the plurality of types of data at a predetermined interval; and
    wherein the method further comprises: changing a transmission interval for the each type of the plurality of types of data based on one or both of a load level of the second controller and a network load level between the relay and the second controller, and transmitting the plurality of types of data to the second controller.

13. The method of claim 12, further comprising:
    determining the one or both of the load level of the second controller and the network load level by one or both of the relay and the second controller.

14. A non-transitory computer-readable recording medium storing a program that causes, by a computer, a substrate processing system to perform a process comprising:
    processing a substrate in each of a plurality of substrate processing apparatuses;
    receiving a plurality of types of data at a relay from a first controller installed in each of the substrate processing apparatuses;
    changing a transmission interval according to either each type of the plurality of types of data or each first controller, or according to the each type of the plurality of types of data and the each first controller, and transmitting the plurality of types of data at the transmission interval from the relay to a second controller; and
    making, by the relay, a reception interval from the first controller different from the transmission interval to the second controller according to either the each type of the plurality of types of data and the each first controller, or according to the each type of the plurality of types of data and the each first controller.

15. The non-transitory computer-readable recording medium of claim 14, wherein the relay receives the plurality of types of data at a predetermined interval; and wherein the process further comprises: changing a transmission interval for the each type of the plurality of types of data based on one or both of a load level of the second controller and a network load level between the relay and the second controller, and transmitting the plurality of types of data to the second controller.

16. The non-transitory computer-readable recording medium of claim 15, wherein the process further comprises: determining the one or both of the load level of the second controller and the network load level by one or both of the relay and the second controller.

* * * * *